United States Patent
Seebach, Jr. et al.

[11] Patent Number: 6,158,911
[45] Date of Patent: Dec. 12, 2000

[54] METHOD AND APPARATUS FOR INSERTION AND RETAINMENT OF POMADE WITHIN A DISPENSER

[75] Inventors: Henry F. Seebach, Jr., Middlebury; Alvydas Velicka, Watertown, both of Conn.

[73] Assignee: Echo Manufacturing Co., Watertown, Conn.

[21] Appl. No.: 09/185,955

[22] Filed: Nov. 4, 1998

[51] Int. Cl.[7] .................................................. B43K 21/08
[52] U.S. Cl. ............................................ 401/78; 401/77
[58] Field of Search .................................. 401/78, 77, 75, 401/71, 68, 55

[56] References Cited

U.S. PATENT DOCUMENTS

| | | | |
|---|---|---|---|
| 2,343,934 | 3/1944 | Segal | 401/78 |
| 2,529,673 | 11/1950 | Blake . | |
| 2,753,991 | 7/1956 | Sherman . | |
| 2,858,937 | 11/1958 | Hoffman . | |
| 2,879,548 | 3/1959 | Croce . | |
| 3,082,869 | 3/1963 | Bau | 401/77 |
| 3,124,245 | 3/1964 | Hopgood . | |
| 3,315,344 | 4/1967 | Niclas . | |
| 3,380,795 | 4/1968 | Gruska . | |
| 3,493,309 | 2/1970 | Grisel . | |
| 4,750,882 | 6/1988 | Bouix . | |
| 4,820,070 | 4/1989 | Spatz | 401/78 |
| 5,186,560 | 2/1993 | Holloway . | |
| 5,186,561 | 2/1993 | Ackermann, et al. . | |
| 5,468,084 | 11/1995 | Boninsegni et al. . | |
| 5,560,727 | 10/1996 | Vaupel . | |
| 5,597,252 | 1/1997 | Ito et al. . | |
| 5,599,124 | 2/1997 | Ackermann et al. . | |
| 5,871,295 | 2/1999 | Bouix | 401/78 |

FOREIGN PATENT DOCUMENTS

| | | |
|---|---|---|
| 607092 | 7/1994 | European Pat. Off. . |
| 0815766 A1 | 1/1998 | European Pat. Off. . |
| 105370 | 2/1960 | France . |
| 439615 | 12/1967 | Switzerland . |
| 2143212A | 2/1985 | United Kingdom . |

OTHER PUBLICATIONS

French Publication 2 548 880 (Jul. 11, 1983).

*Primary Examiner*—David J. Walczak
*Attorney, Agent, or Firm*—Ware Fressola Van Der Sluys & Adolphson LLP

[57] ABSTRACT

A double cup pomade assembly is set forth for improving pomade retention that is adaptable for use with both bottom filling and top filling machinery. A pomade retention cup having at least one pomade retention finger and a snap-fit geometry for anchoring it within an elevator cup. The elevator cup is provided with lugs for interaction with convention extend and retract mechanism. One embodiment of the pomade retention cup is symmetrical eliminating improper insertion into a mold. Another embodiment of the pomade retention cup includes a flange at one end for preventing formula leakage during molding and providing an enlarged surface area to offset the forces generated when the elevator cup is pressed around the pomade retention cup.

22 Claims, 8 Drawing Sheets

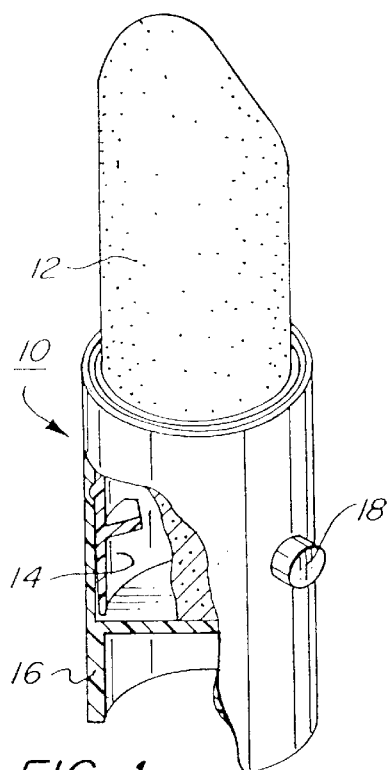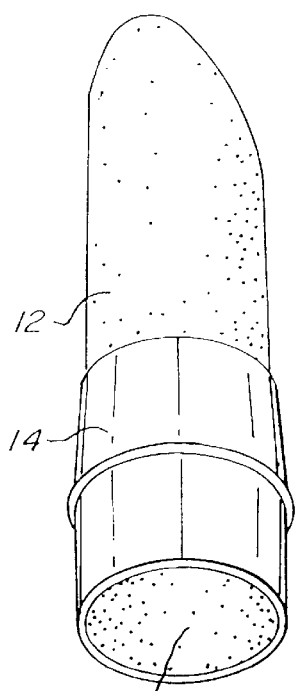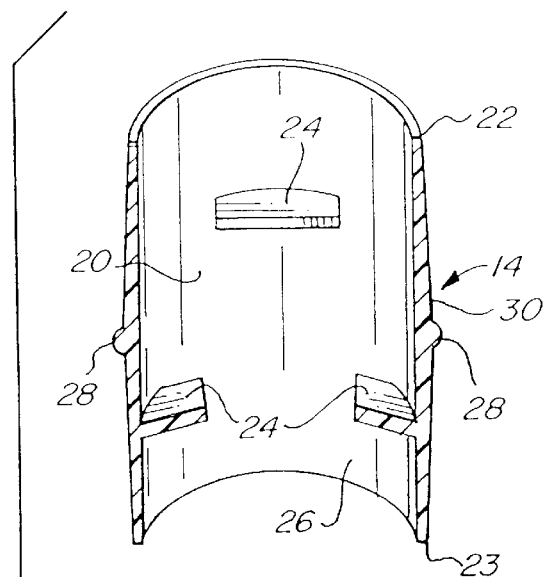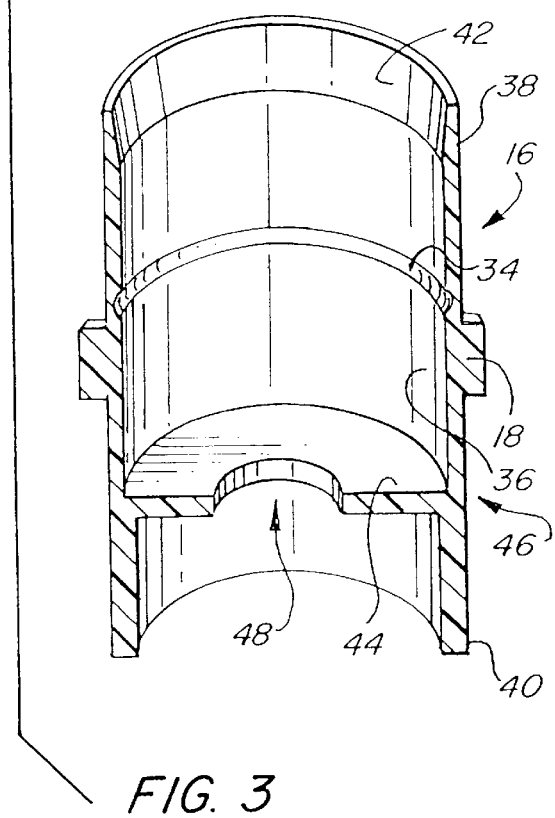
FIG. 1
FIG. 2
FIG. 3

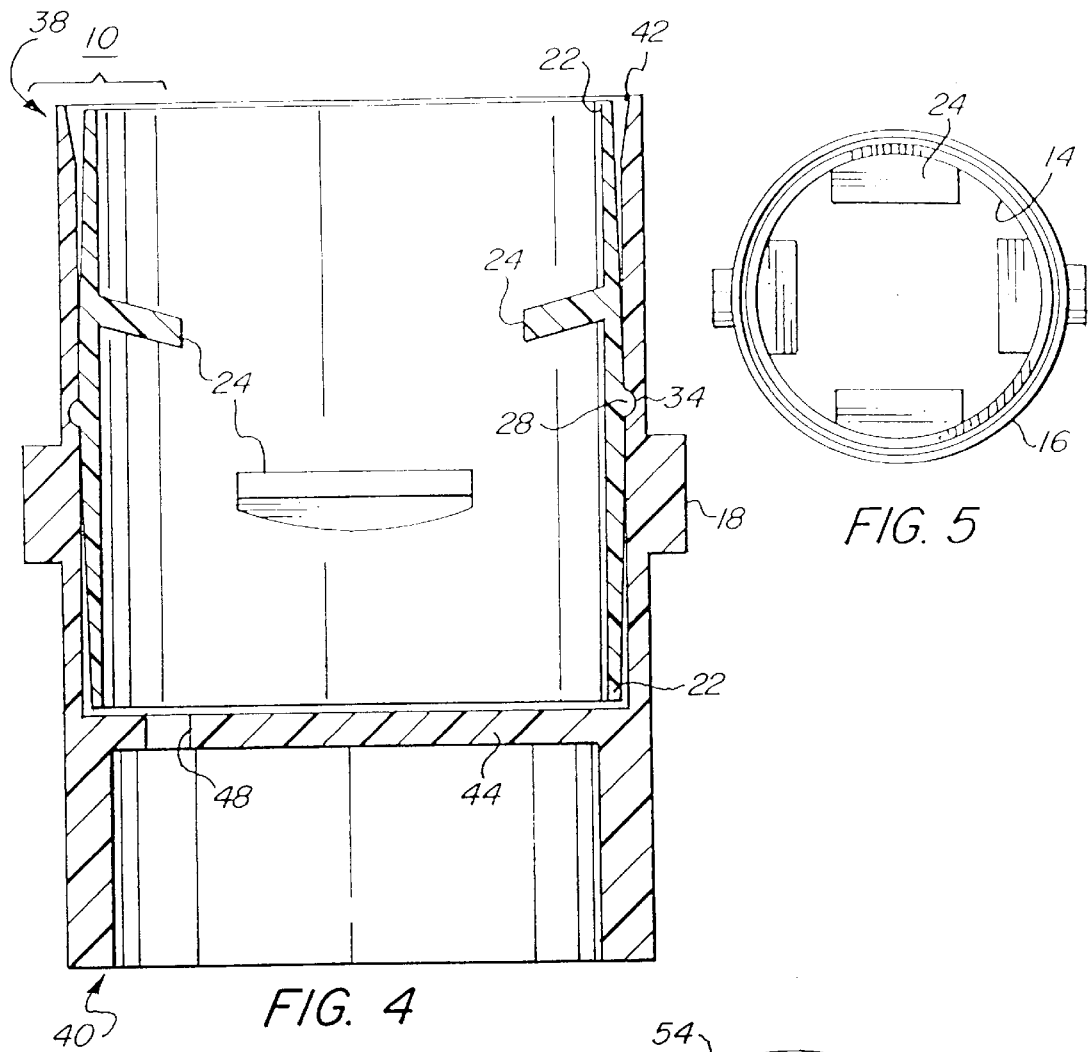
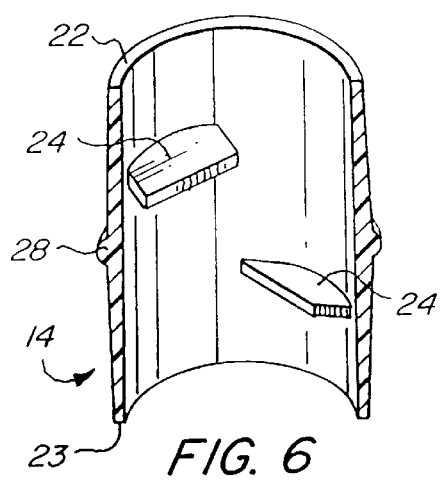
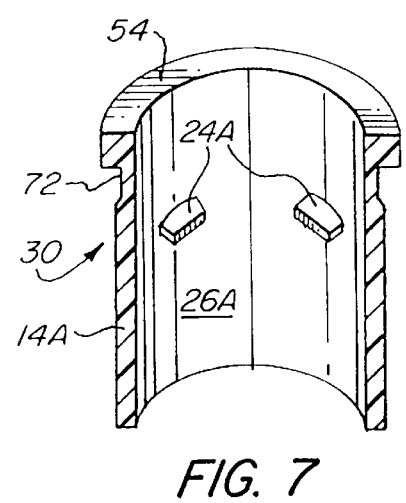

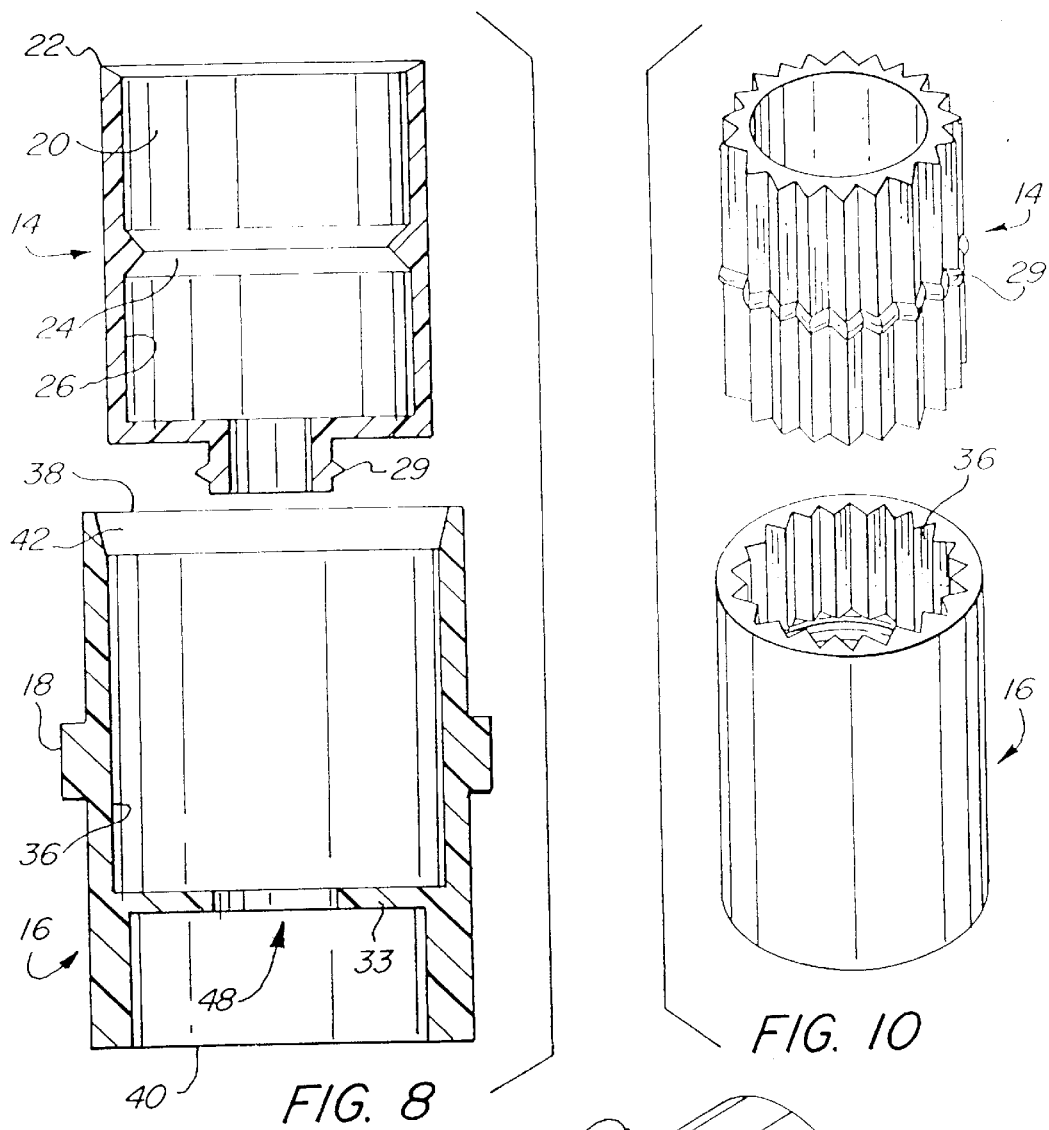
FIG. 8
FIG. 10
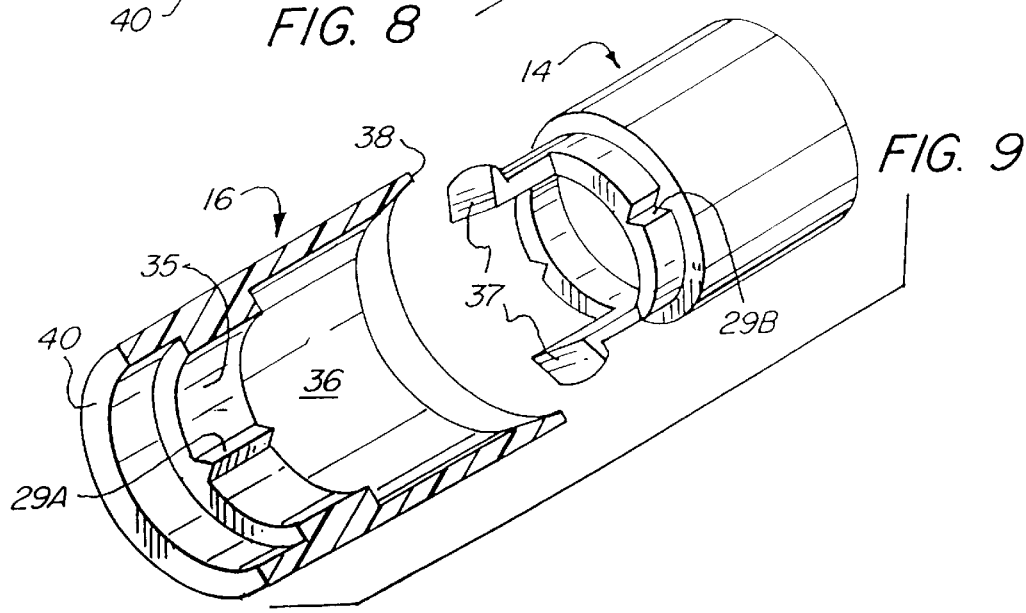
FIG. 9

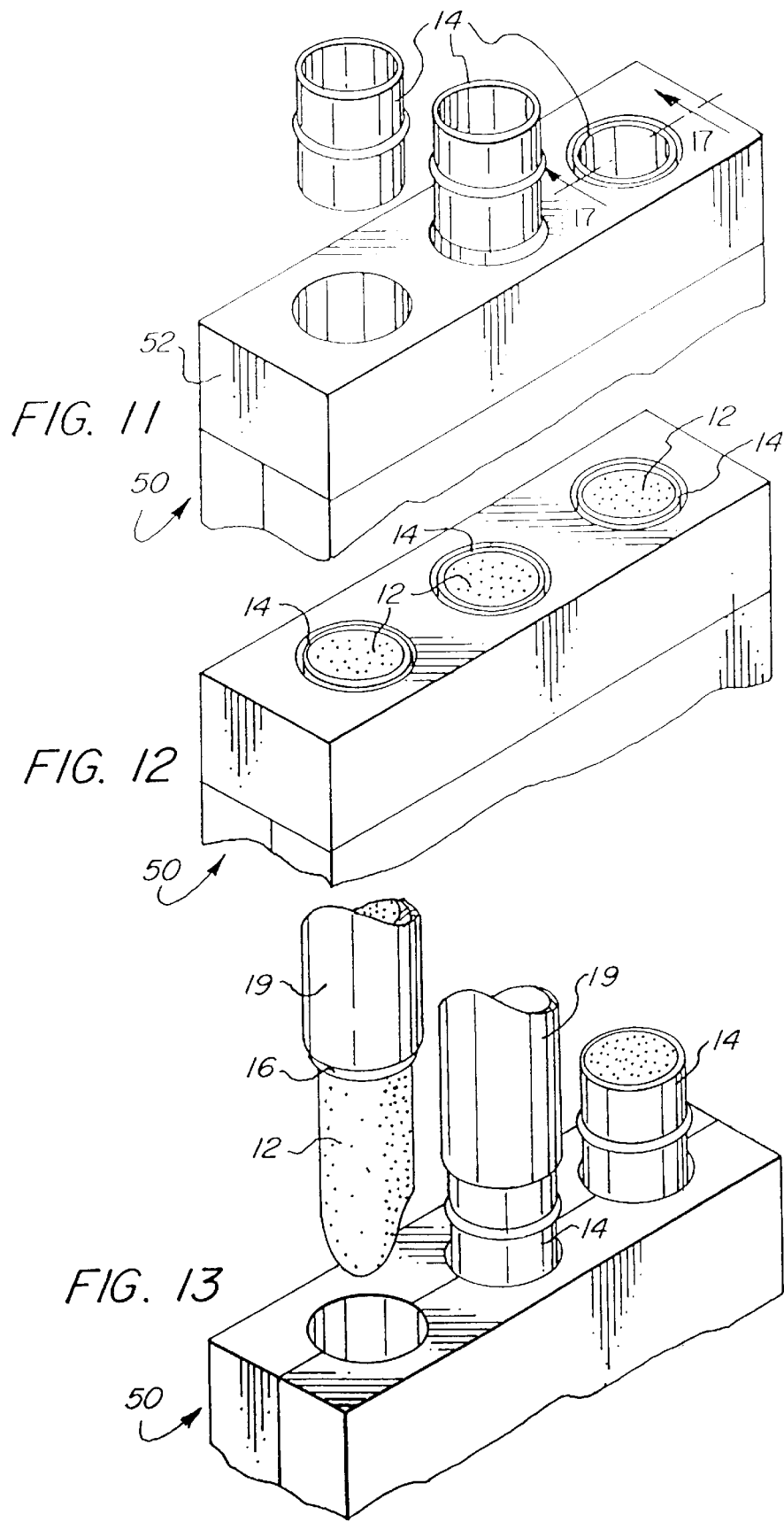

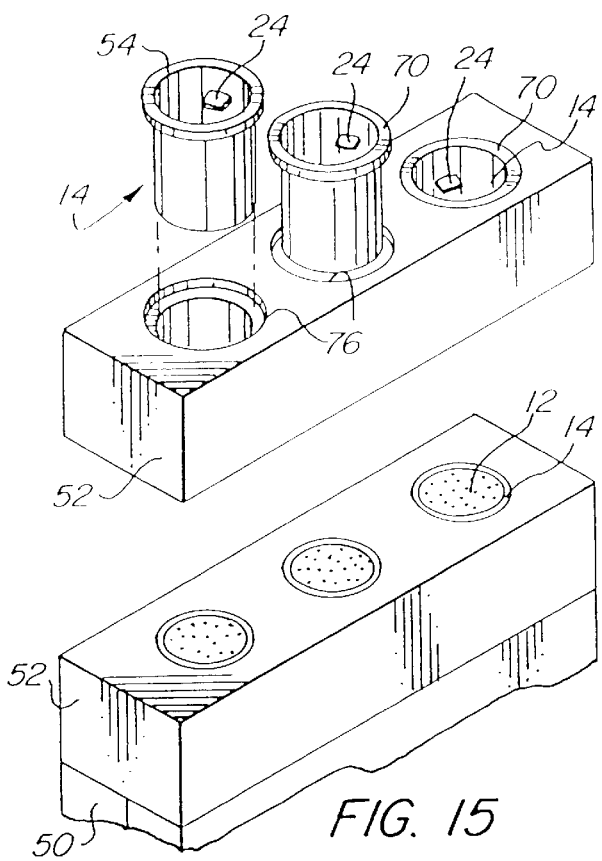
FIG. 14
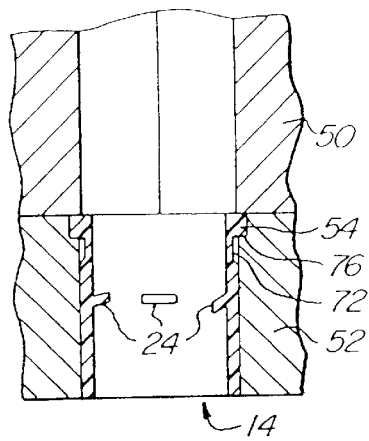
FIG. 14A
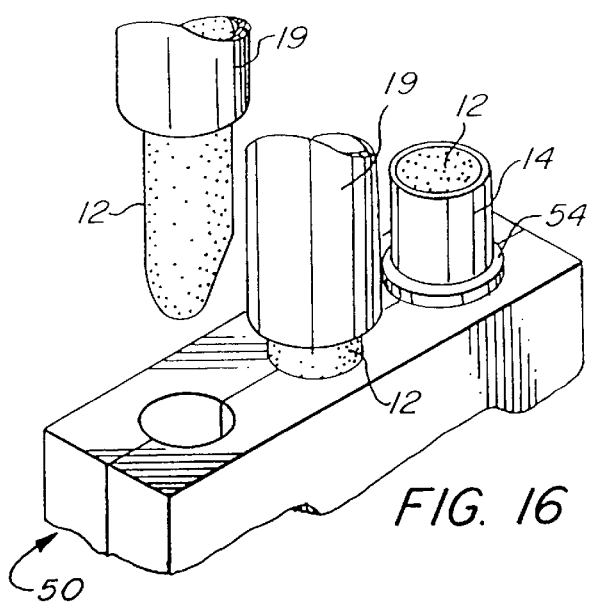
FIG. 15
FIG. 16
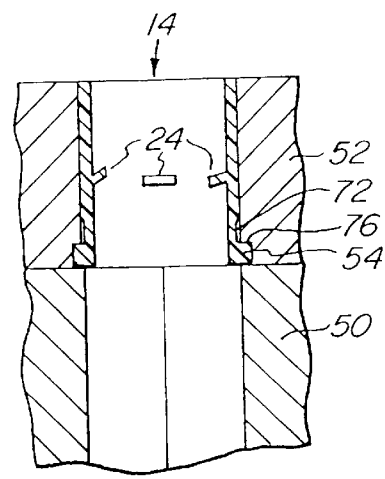
FIG. 20

METHOD AND APPARATUS FOR INSERTION AND RETAINMENT OF POMADE WITHIN A DISPENSER

TECHNICAL FIELD

The present invention generally relates to pomade dispensers; and more particularly, to a pomade cup assembly adaptable for use with top filling and bottom filling production machinery.

BACKGROUND INFORMATION

Pomade dispensers having extend and retract mechanisms are well known. Lipstick, or pomade dispensers, include a pomade cup for holding one end of the lipstick. A pomade cup generally has a pair of lugs extending radially outwardly from opposite sides of the cup. The pomade cup is usually disposed within a vertically slotted inner tube which in turn is concentrically located within a cam tube having helical cam grooves therein. The lugs extend through the vertical slots of the vertically slotted inner tube and into the helical cam grooves of the helically grooved cam tube. By rotating the vertically slotted tube relative to the helically grooved tube the pomade cup is induced via the lugs to move axially in order to selectively extend or retract the lipstick. For ease of use, the vertically slotted inner tube is connected to a base, and the helically grooved cam tube is connected to a shell, which is partially disposed within the base. Therefore, to vertically move the lipstick the shell is rotated with respect to the base.

Various methods are known for inserting pomade into a pomade cup or the like within a pomade dispenser. The method used to position pomade within a dispenser depends on how the pomade is formed, or molded. Generally pomades and the like are molded by heating a mixture beyond its melting point and then pouring the mixture into a female mold. More modern techniques use an injection method to deposit a mixture into a female mold. The shape of the mold and the stage in production where it is used depends on the following description of filling and loading methods.

One method is top filling. First a mixture of pomade is poured into a mold, cooled and then removed from the mold and carefully inserted into a one piece pomade cup already positioned within a case or dispenser. This method inevitably leaves marks on the pomade. The marks are usually removed by flash flaming the surface, such as by passing the exposed pomade quickly through a flame. Another problem with top filling is that of retaining the pomade within the cup. This is especially true of the newer lipstick formulas that contain volatile compounds that shrink over time and can become loose or even fall out of the pomade cup. An attempt at solving this problem is to use vertically oriented ribs within the pomade cup. The ribs help prevent rotation of the pomade within the cup but have failed to solve the fall out problem. Another attempt to solve this problem uses a post with small lug engagement areas, as taught by Vaupel, U.S. Pat. No. 5,560,727. This configuration requires that the pomade be squished around the post, deforming the pomade such that little if any material actually contacts the lug surface. This is especially true of the new mixtures that contain volatile compounds.

Another method of filling pomades into a pomade cup is through the bottom of the dispenser; this is called bottom filling. Bottom filling entails extending the pomade cup to an open end of the inverted dispenser for contact with a mold surface. Alternatively, a tube-shaped mold can be inserted within the dispenser, whereby the pomade cup would remain in its retracted position. When the pomade cup within an inverted dispenser is in contact with the mold a nozzle is inserted through an opening in the bottom of the inverted dispenser and through the pomade cup, and pomade is injected into the mold, thereby filling the mold. The mixture fills the mold and at least a portion of the pomade cup. After the mixture has solidified the dispenser and pomade cup are withdrawn from the mold.

The bottom filling method has several drawbacks. For one, alignment of the dispenser, mold, and mixture nozzle are critical. If the components are not properly aligned, the pomade may end up tilted, causing it to scrape along a sidewall of the dispenser when it is retracted. Another retraction method is to retract the pomade into the dispenser using the retraction mechanism of the dispenser.

These problems lead to another problem with bottom filling. If the pomade is not homogeneously filled, e.g., with entrained air bubbles or incomplete filling of the mold, the entire assembly must be rejected causing the loss of an expensive dispenser.

One solution to reducing inventory problems is shown in Bouix, U.S. Pat. No. 4,750,882. Bouix describes using a tubular cup that can be placed in a top portion of a mold such that if there are any defects in the molding operation then only the tubular cup must be rejected and not an entire case or dispenser. For insertion into a dispenser the Bouix tubular cup is inserted into a cylindrical ring having conventional lugs or studs for use with a dispenser. This method still leaves several unsolved problems. One such problem is that the tubular cup in contact with the pomade is asymmetrical and must therefore be correctly oriented in the mold. Another problem is that the cylindrical ring with the studs must be relatively short which can lead to wobble within the dispenser. Yet another remaining problem, as described further below, is that of pomade retention within the pomade cup itself. Yet another problem is that pomade leaks past the end of the cup during molding.

As mentioned above, recent developments in lipstick formulation have led to lipsticks that give off volatiles. This causes the pomade to shrink during use and can cause the pomade to fall out of the pomade cup. Current pomade cup designs to alleviate this problem require the use of bottom filling, as described above. This means that top filling machinery must be replaced at great capital expense. There are several different types of machinery being used for each method described above. The present invention addresses the foregoing problems as described below.

SUMMARY OF THE INVENTION

The present invention allows the use of all lipstick formulas with top filling machinery by using a double cup pomade assembly for molding, loading, and retaining a pomade within a pomade dispenser. The present invention is also useful in solving the remaining problems with bottom filling machinery as discussed above. The double cup pomade assembly comprises a pomade retention cup and a pomade elevator cup. In one embodiment the pomade retention cup is substantially symmetrical about a centrally located transverse plane passing therethrough. In another embodiment the pomade retention cup has a rim at one end. A means for anchoring the pomade retention cup within the pomade elevator cup is used and the pomade elevator cup includes one or preferably two lugs for use with conventional pomade advance and retraction mechanisms within the pomade dispenser. In this manner the pomade retention cup may be used with top filling pomade machinery as well as bottom filling pomade machinery.

The means for anchoring the pomade retention cup within the pomade elevator cup can be accomplished using a variety of means for achieving a positive assembly.

The preferred embodiments of the present invention use a pomade retention cup that includes at least one pomade retention finger extending radially inwardly in planar fashion from an inner wall of the pomade retention cup.

The pomade retention cup may include a plurality of fingers extending generally radially inwardly from the inner wall of the pomade retention cup, and preferably has a pair of opposed fingers slightly tilted toward a central transverse plane and spaced therefrom and may have a second pair of fingers spaced in opposing fashion on the opposite side of the central transverse plane. The retention fingers are sized to provide axial clearance for a filling nozzle to extend therebetween for injecting pomade formulas into the mold, and into the pomade retention cup as the nozzle is retracted.

The present invention further includes molding the pomade in a bullet shape in a polished mold through a cylindrical open-ended pomade retention cup stepped into a portal end of the mold, allowing a sequential filling operation. The pomade and pomade retention cup are then mechanically anchored to the pomade elevator cup within the lipstick dispenser.

This invention also permits the reworking of damaged pomades during the filling process and simplifies their removal. The double cup pomade assembly can be disassembled without damaging the pomade dispenser. This is achieved by removing the damaged pomade and extracting the pomade retention cup from the pomade elevator cup with a pomade retention cup extraction tool. In this manner, one hundred percent of the pomade dispensers can be recovered and returned to the fill production line.

Other features, objects and advantages of the invention are hereinafter explained in the description of the best mode or preferred embodiments of the invention.

BRIEF DESCRIPTION OF THE DRAWINGS

In the drawings, like reference characters designate like parts throughout the several views, and:

FIG. 1 is an isometric view partially in section showing a double cup pomade assembly according to an embodiment of the present invention;

FIG. 2 is an isometric view of a pomade with one embodiment of a pomade retention cup at a proximal end thereof;

FIG. 3 is an exploded isometric view in section showing one embodiment of a pomade retention cup and one embodiment of a pomade elevator cup;

FIG. 4 is a cross-sectional side elevation view of the components shown in FIG. 3, with the cups in their final assembly positions;

FIG. 5 is a plan view looking down along a vertical axis of a preferred embodiment showing inward projection of pomade retention fingers;

FIG. 6 is an isometric view in section showing one embodiment of angled pomade retention fingers;

FIG. 7 is a view similar to FIG. 6 showing an alternative embodiment of a pomade retention cup;

FIG. 8 is an exploded cross-sectional side elevation view similar to FIG. 3 showing an alternative embodiment of the pomade cup assembly anchoring means;

FIG. 9 is an exploded isometric view partially in section showing another embodiment of the double cup pomade assembly anchoring means;

FIG. 10 is an isometric view of an alternative embodiment for preventing rotational movement between a pomade retention cup and a pomade elevator cup;

FIG. 11 is an isometric view showing a portion of a lipstick mold with one embodiment of pomade retention cups shown in various stages of insertion;

FIG. 12 is a view like FIG. 11 showing pomade retention cups in the mold after being filled with lipstick;

FIG. 13 is a view like FIG. 12 with part of the mold removed exposing the pomade retention cups;

FIG. 14 is a view similar to FIG. 11 showing an alternative embodiment of the pomade retention cup in an inverted trough section of a mold;

FIG. 14A is a cross-sectional elevation view of the retention cup of FIG. 14 in the inverted trough section of the mold, surmounted by mold parts inverted and clamped together.

FIG. 15 is a view like FIG. 12 showing pomade retention cups of FIG. 14 in the mold after being uprighted and filled with lipstick;

FIG. 16 is a view like FIG. 13 with part of the mold removed exposing the filled pomade retention cups;

FIG. 20 is a view similar to FIG. 14A a showing the alternative embodiment of a pomade retention cup within a portion of a mold before filling;

BEST MODE FOR CARRYING OUT THE INVENTION

Figure 17:
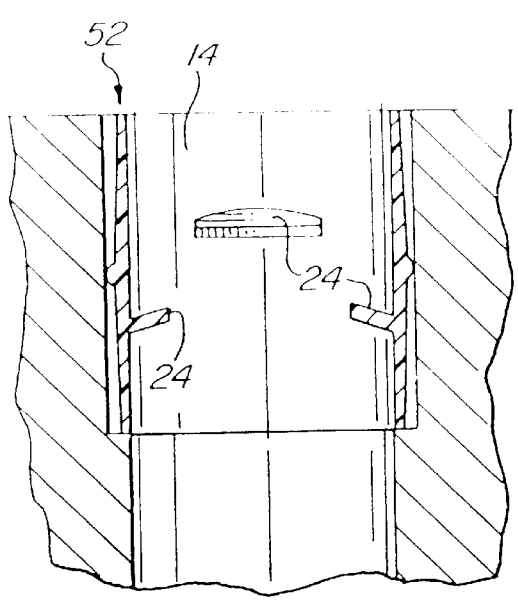
FIG. 17 is a sectional view of a portion of FIG. 11 showing a pomade retention cup positioned within the mold prior to filling.

It is understood that the following is taken in light of the fact that conventional pomade dispenser construction and operation are generally well known to a person having ordinary skill in the art.

Referring now to the several figures of the drawing, and first to FIG. 1, a double cup pomade assembly 10 is shown. A pomade 12 is shown in a pomade retention cup 14 that is held in position within a pomade elevator cup 16, which includes a lug 18 for use in conventional manner in a pomade dispenser 19, partially shown in FIGS. 21 and 22. In these FIGURES, dispenser 19 is shown to incorporate a vertically slotted inner tube 41, surrounded by a helically grooved cam tube 43 embraced in an outer shell 45. In FIG. 2 pomade 12 is shown to substantially fill pomade retention cup 14.

Referring now to FIG. 3, a pomade retention cup 14 and a pomade elevator cup 16 according to a preferred embodiment of the present invention are shown in section without pomade.

The pomade retention cup 14 is essentially a thin-walled cylinder 20 having a circular tubular shape, although an ellipse or any closed curve shape could be substituted therefor. The sidewall of cylinder 20 is preferably slightly tapered from a central location toward each end 22. A pair of pomade retention fingers 24 are formed integral with a sidewall 26 of pomade retention cup 14 and form a means to retain pomade within retention cup 14. Preferably, pomade retention fingers 24 are slightly angled toward a transverse central plane of pomade retention cup 14. It is believed that pomade retention will be maximized without interference during molding if pomade retention fingers 24 are set at 15° from horizontal to the transverse central plane of pomade retention cup 14. An alternative embodiment shown in FIG. 19 has at least one retention finger set at 0° from horizontal. Angles from 0° to 45° would also be effective. In a preferred embodiment, pomade cup 14 is formed symmetrically about the transverse central plane. Therefore, another pair of pomade retention fingers 24 are formed integral with wall 26 but are located on the opposite side of the transverse plane (only one of the other pair of pomade retention fingers 24 is shown in FIG. 3).

A means for anchoring the pomade retention cup 14 and pomade elevator cup 16 together includes a projection 28 on an outer surface 30 of retention cup 14 and a recess 34 in an inside surface 36 of pomade elevator cup 16. Projection 28 is shown in FIG. 3 to be a bead 28 extending above outer surface 30. In preferred form bead 28 extends substantially around the perimeter of pomade retention cup 14. Bead 28 is sized and shaped to fit within recess 34 formed in inside surface 36 of pomade elevator cup 16 and forms a snap fit when the two pieces are pushed together (FIG. 4). Bead 28 and recess 34 are interchangeable and could be on opposite pieces.

Alternative embodiments for forming a positive anchoring between pomade retention cup 14 and pomade elevator cup 16 are shown in FIGS. 8, 9 and 10. FIG. 8 shows a bead 29 on a reduced diameter portion 32 of pomade retention cup 14. Bead 29 interacts in a snap fit manner with venthole 48 formed within a substantial floor member 44 formed in pomade elevator cup 16 and may be integral therewith. FIG. 9 shows an alternative embodiment wherein the means for anchoring includes an inwardly protruding surface 35 on an inside surface 36 that cooperates with finger hooks 37 extending from pomade retention cup 14 to form a snap fit anchoring means. Means to reduce or eliminate rotation between the parts is shown in FIGS. 9 and 10. FIG. 9 shows a tooth 29A and notch 29B arrangement and FIG. 10 shows an interlocking surface treatment of the mating surfaces.

Referring again to FIG. 3, pomade elevator cup 16 is also generally tubular in shape like pomade retention cup 14. Pomade elevator cup 16 is not symmetrical and therefore has a distal or top end 38 and a proximal or bottom end 40. Distal end 38 includes an inward taper 42 for guiding a proximal end 23 of pomade retention cup 14 into pomade elevator cup 16. Substantial floor member 44 is located between recess 34 and the proximal end 40 of pomade elevator cup 16. Floor member 44 is a transverse member that may be formed integral with an inside surface 36 or sidewall. Floor 44 provides support and rigidity to pomade elevator cup 16 which allows a reduced sidewall 36 thickness for reducing the force needed to insert pomade retention cup 14 into pomade elevator cup 16 whiles maintaining sufficient rigidity for operation of the pomade dispenser. However, alternative embodiments may not require use of floor 44.

Pomade elevator cup floor 44 preferably has a vent opening 48 which allows air entrapped within elevator cup 16 to escape during insertion of pomade retention cup 14. While vent opening 48 is not required it is the preferred method of allowing entrapped air to escape. The vent 48 is shown in a central location in FIG. 3 but could alternatively be a relative small hole located off center as shown in FIG. 4.

Turning now to FIG. 4, the relationship between pomade retention cup 14 and pomade elevator cup 16 in their assembled positions can be readily seen. The tapered ends 22 of pomade retention cup 14 help allow for ease of entry into pomade elevator cup 16. Since in one embodiment pomade retention cup 14 is symmetrical, no matter which end 22 is placed into a mold as described below, the other end 22 readily enters inward taper 42 of pomade elevator cup 16 during insertion. An alternative embodiment shown in FIG. 19 with a rim 54, or flange, is used with certain types of molding machinery as described below.

Bead 28 is shown in its seated position within recess or groove 34. There is sufficient friction created between these surfaces to provide resistance to torque therebetween. However, alternative embodiments shown in FIGS. 9 and 10 show methods to further reduce or eliminate rotation due to torque as described above.

FIG. 6 shows the relationship between one each of opposing pairs of pomade retention fingers 24 according to one preferred embodiment. As described in more detail below, pomade retention members 24 shown in FIGS. 5 and 6 are all sized to provide sufficient clearance for a fill nozzle to pass therethrough on its way into a mold.

FIGS. 8–10 show alternative methods of retaining pomade retention cup 14 within pomade elevator cup 16, as described above.

FIGS. 11–13 schematically show insertion of pomade retention cups 14 into a mold 50 having cavities for receiving liquid pomade. Mold 50 includes a trough section 52 which is counter-bored to receive pomade retention cups 14 either wholly or partially, as shown in FIG. 17. It should be noted that in one embodiment (FIGS. 1–4), since pomade retention cup 14 is symmetrical in all respects, it does not have to be oriented for insertion into mold 50, thereby greatly simplifying production. FIG. 12 shows mold 50 with pomade retention cups 14 after filling with liquid pomade and waiting for solidification to occur. Then, as shown in FIG. 13, after trough section 52 is removed to expose pomade retention cups 14, with pomades 12 depending therefrom, each cup 14 can then be removed from mold 50 such as by mechanical assembly of a cup 14 with a pomade dispenser 19 with its pomade elevator cup 16 therein to aid in removal of the pomade 12 by use of retraction means within dispenser 19.

Figure 18:
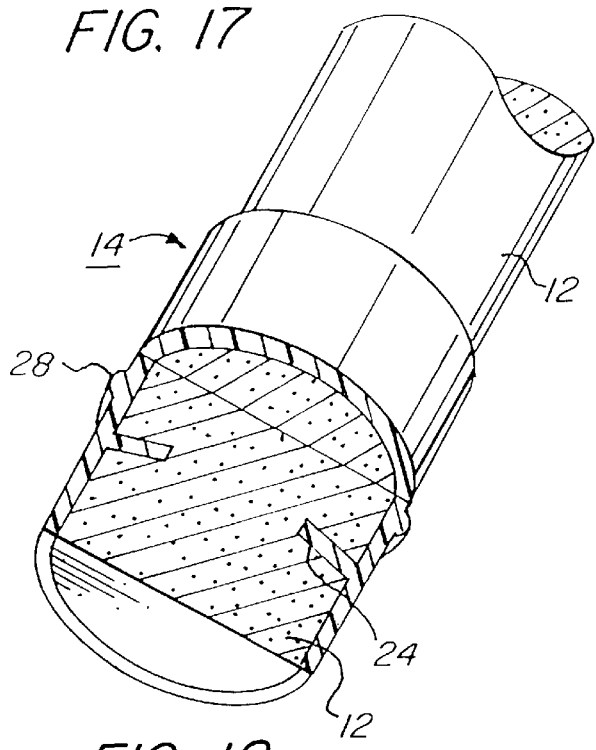
FIG. 18 is a partial sectional isometric view of a pomade showing encapsulation of pomade retention fingers.

FIG. 18 shows how liquid pomade forms around pomade retention fingers 24 after molding. It is readily seen that even if the pomade shrinks that it will still be solidly attached to pomade retention cup 14.

Figure 19:
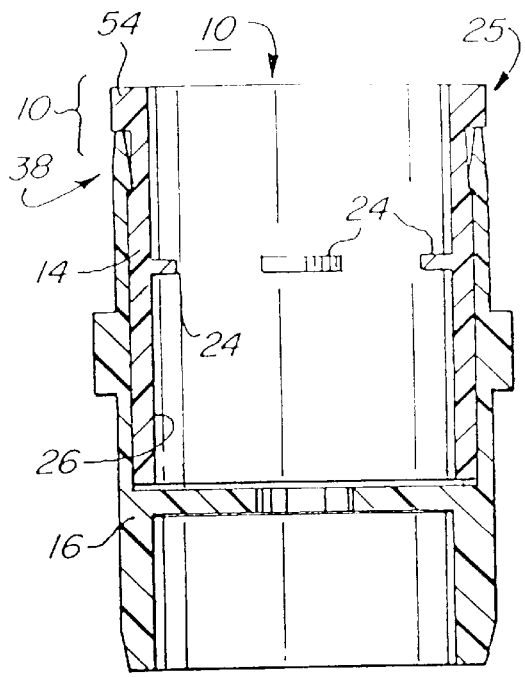
FIG. 19 is a view similar to FIG. 4 showing an alternative embodiment.

Referring now to FIGS. 7 and 14–20, another embodiment of pomade cup assembly 10 is shown. While pomade elevator cup 16 is similar to the embodiment shown in FIGS. 1–5, it varies in accordance with an alternative means for anchoring pomade retention cup 14 within pomade elevator cup 16. As shown in FIG. 19, pomade retention cup 14 includes a rim 54 or flange that serves several purposes as described below. The means for anchoring rimmed pomade retention cup 14 within pomade elevator cup 16 includes a reduced diameter area 72 (FIGS. 7, 20) juxtaposed under rim 54 on the outer surface 30 of pomade retention cup 14 and separating rim 54 from full diameter portion 14A (FIG. 7), which telescopes within elevator cup 16 for positive alignment. An internal protrusion 74 (FIG. 22) forming a hook-like structure at the distal end 38 of pomade elevator cup 16 interacts with reduced diameter area 72 to form a snap fit anchoring means. Pomade retention fingers 24, extend radially inwardly from the side wall 26 of pomade retention cup 14. The retention fingers 24 may be formed either at 0° to the horizontal or be tilted away from distal rim end 25 of pomade retention cup 14 as shown in FIG. 19.

FIG. 7 shows how the plurality of pomade retention fingers 24 would extend radially inwardly from side wall 26 and may be sloped away from rim 54.

Referring to FIGS. 14–16, and 20, the rimmed embodiment of pomade retention cup 14 is described in relation to use with mold 50. Starting with FIG. 14, the trough section 52 of mold 50 is inverted and has small counterbores 76 sized to receive rim 54. After pomade retention cups 14 are inserted into the inverted trough section 52 (FIG. 14), mold 50 is inverted and placed on top thereof and the mold parts are clamped together (FIG. 14A). Mold section 52 and mold 50 are then uprighted as shown in FIG. 20. After pomade 12 is poured into cavities in the mold 50 and solidified FIG. 15, trough section 52 is removed as shown in FIG. 16. The removal of mold trough 52 exposes rimmed pomade retention cups 14 as shown and described previously in respect to FIG. 13. Pomade dispenser 19 with pomade elevator cup 16 therewithin is then placed over pomade retention cup 14 and pressed into snap fit relationship thereby anchoring pomade retention cup 14 within pomade elevator cup 16. The dispenser 19 may be rotated or axially withdrawn to retract elevator cup 16 therewithin, thereby withdrawing pomade 12 into the dispenser 19.

Referring again to FIG. 20, it can be readily seen how flange 54 provides a reliable seal with mold 50 thereby preventing pomade from leaking around pomade retention cup 14. Rim 54 is also beneficial in providing a substantial base such that the snap fit into pomade elevator cup 16 can be performed at higher speeds using greater forces. Rim 54 also provides for registration and alignment within pomade elevator cup 16 such that the distal end 38 of the pomade elevator cup contacts rim 54 (FIG. 19).

Figure 21:
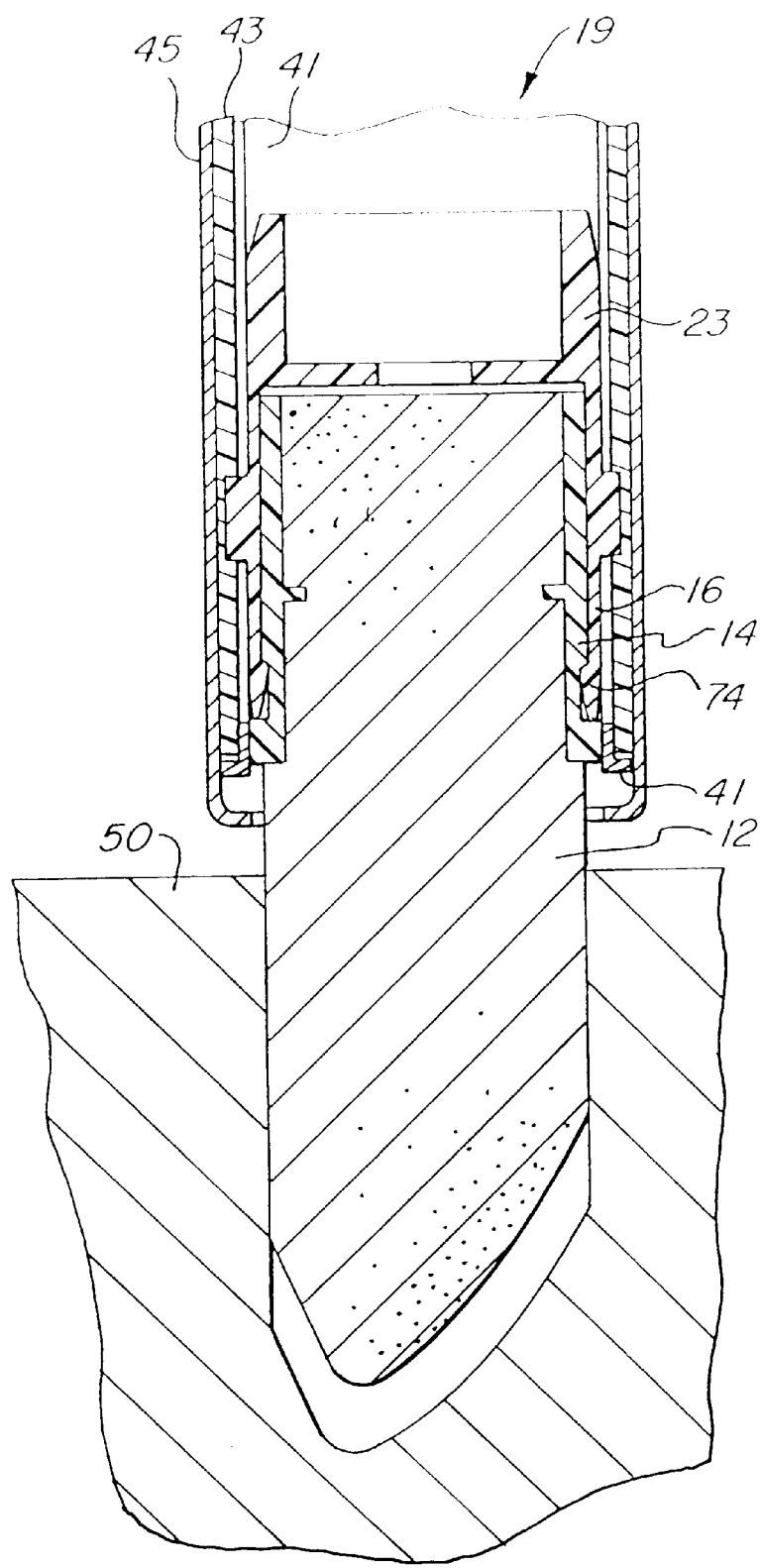
FIG. 21 is a fragmentary sectional side elevation view showing engagement of a pomade retention cup with a pomade elevator cup.
Figure 22:
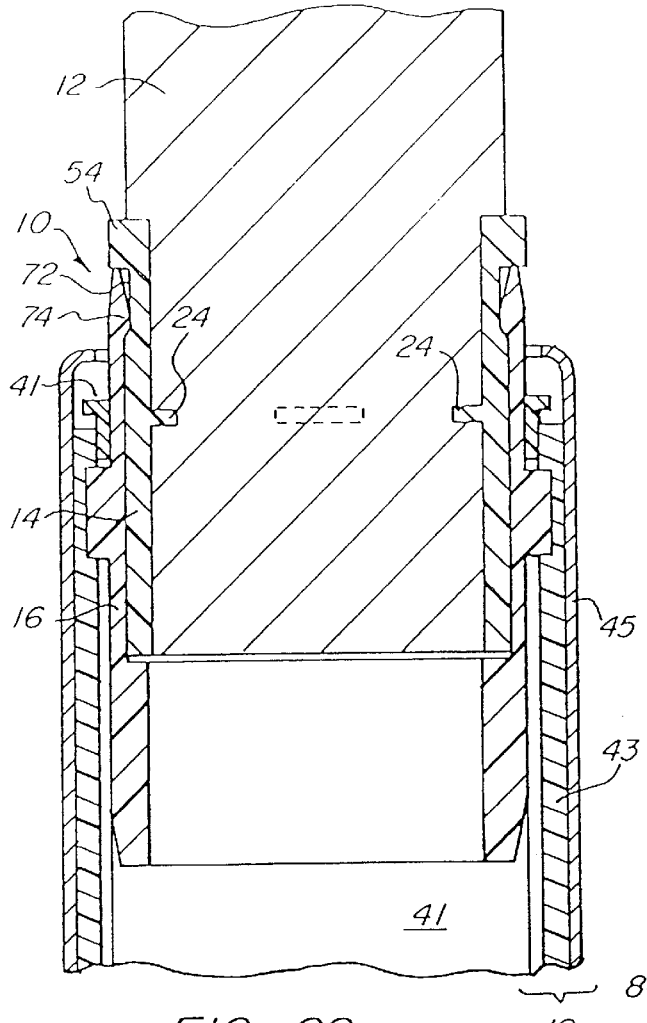
FIG. 22 is a fragmentary sectional elevation view showing an alternative embodiment of a pomade double cup assembly in a portion of a dispenser.

FIG. 21 shows the relationship between pomade retention cup 14, pomade elevator cup 16, pomade dispenser 19 and mold SO during retraction of pomade 12 by dispenser 19. As shown in FIG. 22, pomade elevator cup 16 can be formed without floor 44.

Figure 23:
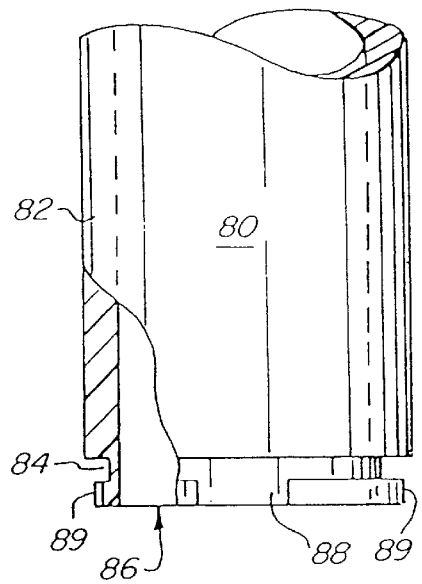
FIG. 23 is a fragmentary front view partially in section of a pomade retention cup removal tool.
Figure 24:
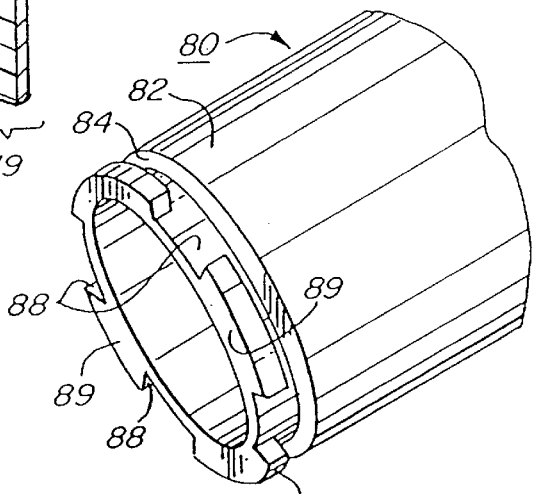
FIG. 24 is a fragmentary isometric view of a portion of the same removal tool.

Referring now to FIGS. 23 and 24, another advantage of the present invention is that damaged or improperly aligned pomade retention cup 14 units can be removed from dispenser 19, so that the dispenser 19 can be reused. To accomplish removal of pomade retention cup 14, pomade extraction tool 80 may be used (FIGS. 23, and 24). Pomade extraction tool 80 includes a tubular portion 82 having a groove 84 juxtaposed to end 86 thereof. A number of slots 88 equal to the preselected number of retention fingers 24 are formed between radial ledges 89, connecting end 86 and the base of groove 84. Tubular portion 82 is sized to fit within pomade retention cup 14 such that to remove the retention cup pomade is cut off near the distal rim end of the pomade retention cup and extraction tool 80 is then inserted aligning slots 88 with retention fingers 24. Once pomade retention fingers 24 are within groove 84 the extraction tool 80 is rotated thereby locking pomade retention fingers 24 within groove 84, above ledges 89. When extraction tool 80 is withdrawn, the grip on pomade retention fingers 24 is used to break the snap fit anchoring pomade retention cup 14 within pomade elevator cup 16, and allowing the retention cup to be removed.

It will thus be seen that the objects set forth above, and those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A pomade cup assembly for use with a pomade dispenser, said pomade cup assembly comprising:

a pomade retention cup with a longitudinal axis, said pomade retention cup being tubular in shape and substantially symmetrical about a side-to-side transverse plane passing therethrough perpendicular to said longitudinal axis, and retention finger means extended within said pomade retention cup substantially preventing pomade molded therein from moving relative to the pomade retention cup;

a pomade elevator cup, an interfering and resiliently deformable means for removably anchoring said pomade retention cup within said pomade elevator cup, said anchoring means including a projection extending from one of said pomade retention cup and said pomade elevator cup and engaging a recess in the other of said pomade retention cup and said pomade elevator cup in a snap fit manner;

said pomade elevator cup having a lug for conventional pomade advance and retraction within said pomade dispenser, whereby said pomade retention cup may be used with top filling pomade machinery as well as bottom filling pomade machinery.

2. A pomade cup assembly according to claim 1, wherein said retention finger means includes at least one pomade retention finger extending substantially radially inwardly in planar fashion from an inner wall of said pomade retention cup.

3. A pomade cup assembly according to claim 2, wherein said at least one pomade retention finger is angled toward said transverse plane.

4. A pomade cup assembly according to claim 2, wherein said at least one pomade retention finger is a plurality of pomade retention fingers extending substantially radially inwardly from said inner wall of said pomade retention cup.

5. A pomade cup assembly according to claim 4, wherein said plurality of pomade retention fingers are arranged in a symmetrical fashion about said transverse plane.

6. A pomade cup assembly according to claim 5, wherein said plurality of pomade retention fingers are equally distributed above and below said transverse plane.

7. A pomade cup assembly according to claim 4, wherein said plurality of pomade retention fingers are sized to provide axial clearance for a nozzle to move therebetween.

8. A pomade cup assembly according to claim 4, wherein said plurality of pomade retention fingers are angled toward said transverse plane.

9. A pomade cup assembly for use with a pomade dispenser, said pomade cup assembly comprising:

a pomade retention cup with a longitudinal axis, said pomade retention cup being tubular in shape with a proximal end and a distal end and being substantially internally symmetrical about a side-to-side transverse plane passing therethrough perpendicular to said longitudinal axis, and having an external protecting rim flange protruding radially outward at its distal end;

a pomade elevator cup, an interfering and resiliently deformable means for removably anchoring said pomade retention cup within said pomade elevator cup, said anchoring means including a projection extending from one of said pomade retention cup and said pomade elevator cup and engaging a recess in the other of said pomade retention cup and said pomade elevator cup in a snap fit manner; and a means extending within said pomade retention cup for substantially preventing pomade molded therein from moving relative to the pomade retention cup whereby in use pomade is molded in place within and extending from said distal end of the pomade retention cup, the pomade retention cup is inserted within the pomade elevator cup which is mounted within the pomade dispenser in conventional manner for extension and retraction, the pomade being retained extending from the pomade retention cup even if the pomade shrinks.

10. A pomade cup assembly according to claim 9, wherein said pomade retention cup includes at least one pomade retention finger extending substantially radially inwardly in planar fashion from an inner wall of said pomade retention cup.

11. A pomade cup assembly according to claim 10, wherein said at least one pomade retention finger is angled toward said transverse plane.

12. A pomade cup assembly according to claim 10, wherein said at least one pomade retention finger is a plurality of pomade retention fingers extending substantially radially inwardly from said inner wall of said pomade retention cup.

13. A pomade cup assembly according to claim 12, wherein said plurality of pomade retention fingers are arranged in a symmetrical fashion about a transverse plane passing through said pomade retention cup.

14. A pomade cup assembly according to claim 13, wherein said plurality of pomade retention fingers are equally distributed above and below said transverse plane.

15. A pomade cup assembly according to claim 13, wherein said plurality of pomade retention fingers are sized to provide axial clearance for a nozzle to move axially therethrough.

16. A pomade cup assembly for use with a pomade dispenser, said pomade cup assembly comprising:

a pomade retention cup, said pomade retention cup being tubular in shape and having a central longitudinal axis and at least one pomade retention finger extending radially inwardly from an inner wall of said pomade retention cup;

a pomade elevator cup, a means for removably anchoring said pomade retention cup within said pomade elevator cup wherein said means for anchoring said pomade retention cup within said pomade elevator cup includes a projection extending inwardly from said pomade elevator cup and a recess in said pomade retention cup engageable with said projection in a snap fit manner; and a lug on an outer surface of said pomade elevator cup for conventional pomade advance and retraction within said pomade dispenser, whereby said pomade retention cup may be used with top filling pomade machinery as well as bottom filling pomade machinery.

17. A pomade cup assembly according to claim 16, wherein said means for anchoring said pomade retention cup within said pomade elevator cup is juxtaposed to an end of said pomade retention cup.

18. A pomade cup assembly according to claim 17, wherein said pomade retention cup includes a rim extending radially outwardly from a distal end of said pomade retention cup.

19. A pomade cup assembly according to claim 18, wherein said pomade retention finger is angle away from said distal end of said pomade retention cup.

20. A pomade cup assembly according to claim 16, wherein said at least one pomade retention finger is a plurality of pomade retention fingers extending substantially radially inwardly from said inner wall of said pomade retention cup.

21. A pomade cup assembly according to claim 20, wherein said plurality of pomade retention fingers are arranged in a symmetrical fashion about a transverse plane perpendicular to said longitudinal axis passing through a central point of said pomade retention cup.

22. A pomade cup assembly according to claim 21, wherein said plurality of pomade retention fingers are sized to provide axial clearance for a dive nozzle to move axially therebetween.

* * * * *

UNITED STATES PATENT AND TRADEMARK OFFICE
CERTIFICATE OF CORRECTION

PATENT NO. : 6,158,911
DATED : December 12, 2000
INVENTOR(S) : Henry F. Seebach, Jr. and Alvydas Velicka It is certified that error appears in the above-identified patent and that said Letters Patent is hereby corrected as shown below:

Column 4,
Line 33, "a" should be deleted.
Line 34, "within a" should be changed to -- in an uprighted --.

Column 5,
Line 62, "whiles" should be -- while --.

Column 7,
Line 5, "," should be deleted.
Line 44, "So" should be -- 50 --.

Column 9,
Line 4, "protecting" should -- projecting --.
Line 46, "axial" should be deleted.

Signed and Sealed this

Twenty-second Day of October, 2002

Attest:

JAMES E. ROGAN
Attesting Officer    Director of the United States Patent and Trademark Office